(12) United States Patent  
Spencer et al.

(10) Patent No.: US 7,378,306 B2  
(45) Date of Patent: May 27, 2008

(54) SELECTIVE SILICON DEPOSITION FOR PLANARIZED DUAL SURFACE ORIENTATION INTEGRATION

(75) Inventors: Gregory S. Spencer, Pflugerville, TX (US); Peter J. Beckage, Austin, TX (US); Mariam G. Sadaka, Austin, TX (US); Veer Dhandapani, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 66 days.

(21) Appl. No.: 11/375,763

(22) Filed: Mar. 14, 2006

(65) Prior Publication Data

US 2007/0218659 A1 Sep. 20, 2007

(51) Int. Cl.
*H01L 21/8238* (2006.01)
(52) U.S. Cl. ............... 438/199; 438/422; 257/E21.632
(58) Field of Classification Search ............... 438/173, 438/192, 197–200, 206, 212, 268, 478, 479–481, 438/142, 207, 218, 220–222, 296, 424, 425, 438/426, 427, 435; 257/E27.064, E21.632
See application file for complete search history.

(56) References Cited

U.S. PATENT DOCUMENTS

| | | | |
|---|---|---|---|
| 5,627,395 A * | 5/1997 | Witek et al. ................. 257/350 |
| 5,705,409 A * | 1/1998 | Witek .......................... 438/212 |
| 6,214,653 B1 | 4/2001 | Chen et al. .................. 438/153 |
| 6,245,161 B1 | 6/2001 | Henley et al. ............. 148/33.4 |
| 6,558,802 B1 | 5/2003 | Henley et al. .............. 428/446 |
| 6,649,494 B2 | 11/2003 | Tamura et al. .............. 438/481 |
| 6,815,278 B1 | 11/2004 | Ieong et al. ................. 438/198 |
| 6,825,534 B2 | 11/2004 | Chen et al. .................. 257/354 |
| 6,992,003 B2 * | 1/2006 | Spencer et al. ............. 438/638 |
| 2002/0175370 A1 | 11/2002 | Bockelman ................. 257/344 |
| 2003/0017622 A1 | 1/2003 | Mastroianna ................... 438/3 |

* cited by examiner

*Primary Examiner*—Brook Kebede
(74) *Attorney, Agent, or Firm*—Hamilton & Terrile, LLP; Michael Rocco Cannatti

(57) ABSTRACT

A semiconductor process and apparatus provide a planarized hybrid substrate (225) having a more uniform polish surface (300) by thickening an SOI semiconductor layer (210) in relation to a previously or subsequently formed epitaxial silicon layer (220) with a selective silicon deposition process that covers the SOI semiconductor layer (210) with a crystalline semiconductor layer (216). By forming first gate electrodes (151) over a first SOI substrate (90) using deposited (100) silicon and forming second gate electrodes (161) over an epitaxially grown (110) silicon substrate (70), a high performance CMOS device is obtained which includes high-k metal PMOS gate electrodes (161) having improved hole mobility.

20 Claims, 6 Drawing Sheets

SELECTIVE SILICON DEPOSITION FOR PLANARIZED DUAL SURFACE ORIENTATION INTEGRATION

BACKGROUND OF THE INVENTION

1. Field of the Invention

The present invention is directed in general to the field of semiconductor devices. In one aspect, the present invention relates to high-performance complementary metal oxide semiconductor (CMOS) field effect transistors (FETs) fabricated on hybrid substrates.

2. Description of the Related Art

To address the difference in electron and hole mobility values for NMOS and PMOS transistor devices formed on semiconductor wafers having a single crystal orientation, CMOS devices are increasingly fabricated with hybrid substrates with different surface orientations using semiconductor-on-insulator (SOI) wafer bonding to provide PMOS and NMOS devices with their own optimized crystal orientation. Prior attempts to integrate dual or hybrid substrates have used epitaxial growth to form one of the crystal surface orientations, but have resulted in non-uniform silicon step/recess heights between the different crystal surfaces after the grown epitaxial material is polished with a chemical mechanical polish (CMP) step. The different surface heights are caused by pattern density effects and the CMP dishing sensitivity of structures of varying sizes and structure density which create variations in post-CMP uniformity. Another source of surface height difference is the presence of a polish stop layer used during the shallow trench isolation (STI) and CMP processing steps. An example is depicted in FIGS. 1-3 which show a device 10 having two crystal surface orientations—surface 1 having a first orientation and a semiconductor-on-insulator (SOI) layer 3 having a second orientation—separated by buried oxide layers 2 and isolation regions 4 and covered by nitride layers 6. As shown in FIG. 1, an epi silicon layer 7 (having the first orientation) is formed in an opening in the device 10. After the epi silicon 8 is polished (as depicted in FIG. 2), the surface of the epi silicon 8 is recessed below the nitride layer 6. However, when the nitride layer 6 is stripped (as depicted in FIG. 3), the epi silicon 8 is higher than the underlying SOI layer 3. The non-uniform surface heights impair photolithography control and increase dispersion of device parametrics and performance, especially when the sizes and density of the device structures vary.

Accordingly, a need exists for a semiconductor manufacturing process which improves the post-CMP planarity of the dual surface orientation devices. There is also a need for a fabrication process which avoids the process and performance limitations associated with non-uniform surface heights and minimizes surface step heights in a Dual-Surface Orientation (DSO) integration. In addition, there is a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
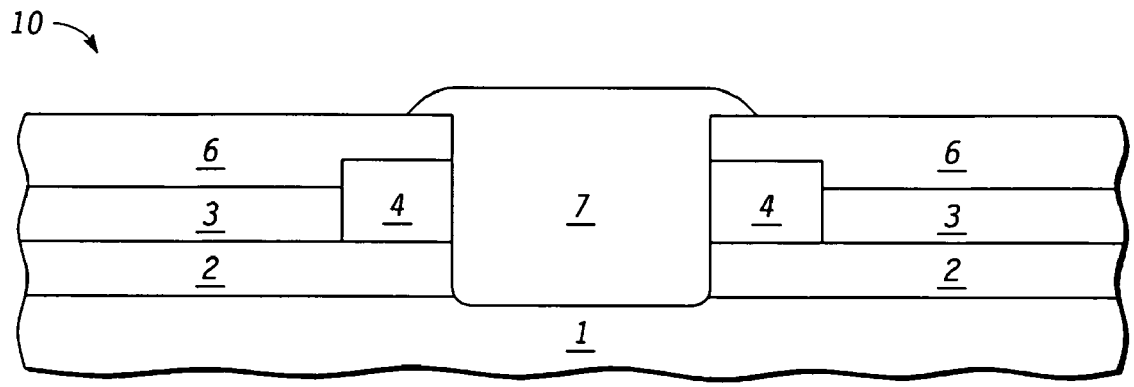
FIG. 1 is a partial cross-sectional view of a conventionally formed dual surface orientation wafer structure after formation of a selective epitaxial semiconductor layer.
Figure 2:
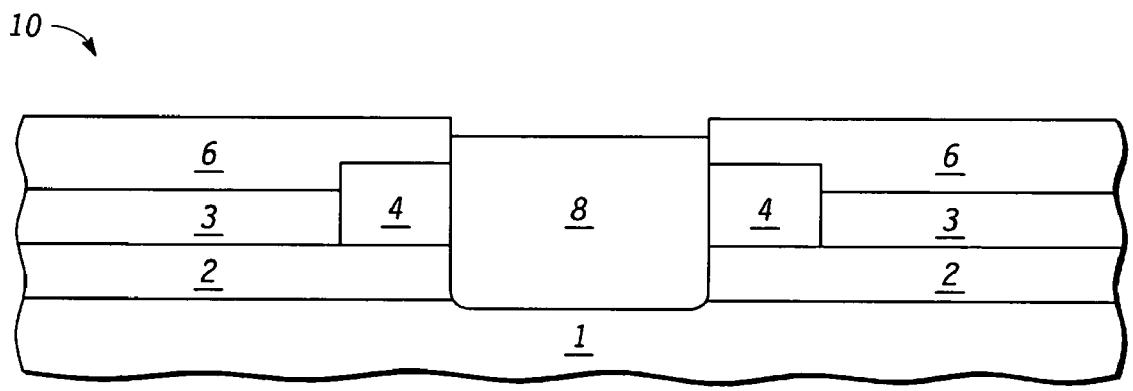
FIG. 2 illustrates processing subsequent to FIG. 1 after polishing of the epi semiconductor layer.
Figure 3:
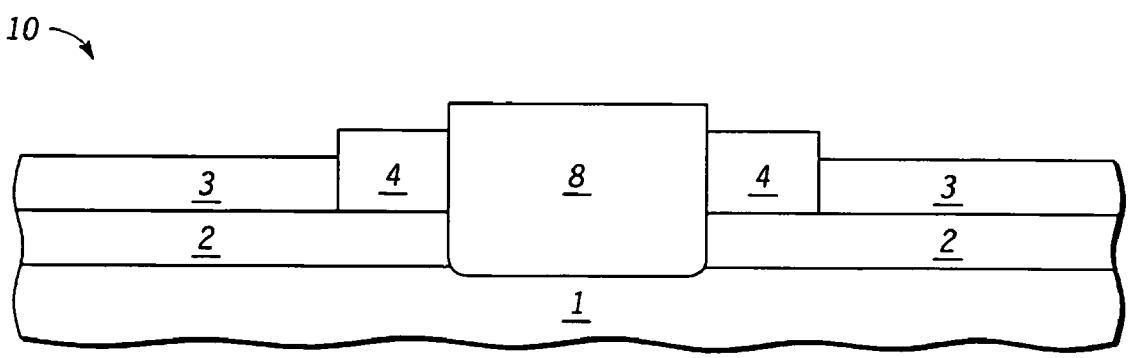
FIG. 3 illustrates processing subsequent to FIG. 2 after a nitride layer is stripped, leaving two surfaces having non-uniform heights.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating high performance CMOS devices with hybrid substrates having substantially uniform surface heights by thickening an SOI semiconductor layer in relation to a previously or subsequently formed epitaxial silicon layer with a selective silicon deposition process that covers the SOI semiconductor layer with a crystalline semiconductor layer. When a previously formed epitaxial layer is used to form a first surface by filling a trench opening, the nitride mask layer used to define the trench opening may be stripped before the SOI semiconductor layer is thickened. In another embodiment when the SOI semiconductor layer is thickened before forming the trench opening, the nitride mask layer used to define and fill the trench opening with an epi semiconductor layer may be stripped before the thickened SOI semiconductor and epi semiconductor layer are polished. With either approach, substantially planar substrate surfaces are formed so that subsequent chemical mechanical polishing has reduced post-polish variation between large and small features in isolated and dense areas. The polishing may be aided by including a blanket silicon deposition step that forms polysilicon (along with the crystalline silicon) which results in elevated polishing temperatures during polishing, possible due to an increase in friction or an exothermic chemical reaction of the slurry and silicon. By improving the post-CMP planarization of the dual substrates, better photolithography control is obtained and dispersion in device parametrics and performance is reduced. In addition, improved planarity in the pre-CMP substrate heights reduces non-uniformity due to variations is structure widths and device densities. Thus, integration of Dual-Surface Orientation (DSO) substrates is promoted by epitaxially depositing a silicon substrate layers using a combination of selective and non-selective (i.e., blanket) deposition processes.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Figure 4:
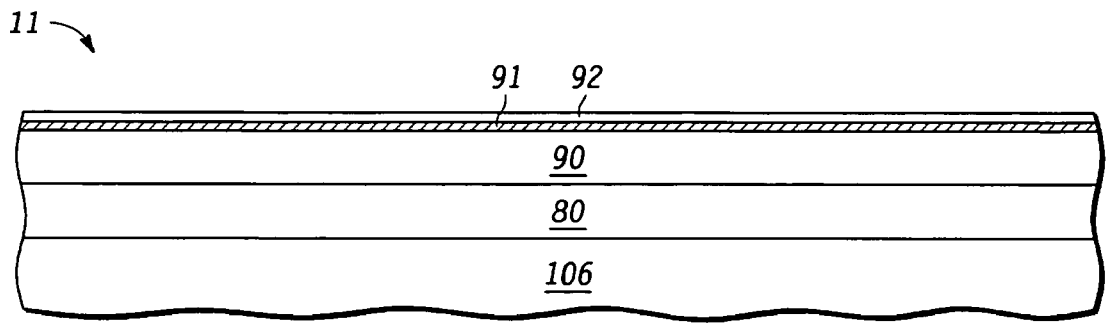
FIG. 4 is a partial cross-sectional view of a semiconductor wafer structure having SOI layers formed over a semiconductor substrate in accordance with an exemplary embodiment where the SOI semiconductor layer is thickened after formation of an epi semiconductor layer.

Turning now to FIG. 4, a partial cross-sectional view is illustrated of a semiconductor wafer structure 11 having semiconductor-on-insulator (SOI) layers 80, 90 formed over a semiconductor substrate layer 106 in accordance with an exemplary embodiment where the SOI semiconductor layer 90 is thickened after formation of an epi semiconductor layer. Specifically, the structure 11 includes a first semiconductor layer 106 formed of a semiconductor material that has a first crystallographic orientation. Depending on the type of transistor device being fabricated, the first semiconductor layer 106 may be implemented as a bulk silicon substrate, single crystalline silicon (doped or undoped), SOI substrate, or any semiconductor material including, for example, Si, SiC, SiGe, SiGeC, Ge, GaAs, InAs, InP as well as other Group III-IV compound semiconductors or any combination thereof, and may optionally be formed as the bulk handling wafer. As will be appreciated, the semiconductor layer 106 may be appropriately doped to provided n-type (electron) and p-type (hole) carriers. The crystallographic orientation of the first semiconductor layer 106 may be (110), (111), or (100).

In the SOI layers, the structure 11 includes an insulator layer 80 formed on the first semiconductor layer 106 which will ultimately be used to form the buried oxide (BOX) layer for silicon-on-insulator devices. In addition, the SOI layers include a second semiconductor layer 90 formed of a semiconductor material which has a second crystallographic orientation which is different from the first crystallographic orientation. Depending on the type of transistor device being fabricated, the second semiconductor layer 90 may be formed from any semiconductor material, including, for example, Si, SiC, SiGe, SiGeC, Ge, GaAs, InAs, InP as well as other III/V or II/VI compound semiconductors or any combination thereof. It will also be appreciated that the second semiconductor layer 90 may be appropriately doped to provided n-type (electron) and p-type (hole) carriers. The crystallographic orientation of the second semiconductor layer 90 may be (100), (111), or (110), so long as the crystallographic orientation of the second semiconductor layer 90 differs from the crystallographic orientation of the first semiconductor layer 106. The crystal orientations of the first semiconductor layer 106 and the second semiconductor layer 90 will depend on the materials used to form the wafer structure 11. For example, when Si is employed as the semiconductor material, electron mobility is higher on a (100) surface orientation, and hole mobility is higher on a (110) surface orientation provided that the channel direction is oriented in the <110> direction. In this case, the (100) Si surface is used as the substrate layer for NMOS devices, while the (110) Si surface is used as the substrate layer for PMOS devices. As depicted in FIG. 4, an oxide layer 91 (e.g., pad oxide) is formed on the second semiconductor layer 90, followed by deposition of a nitride layer 92.

Figure 5:
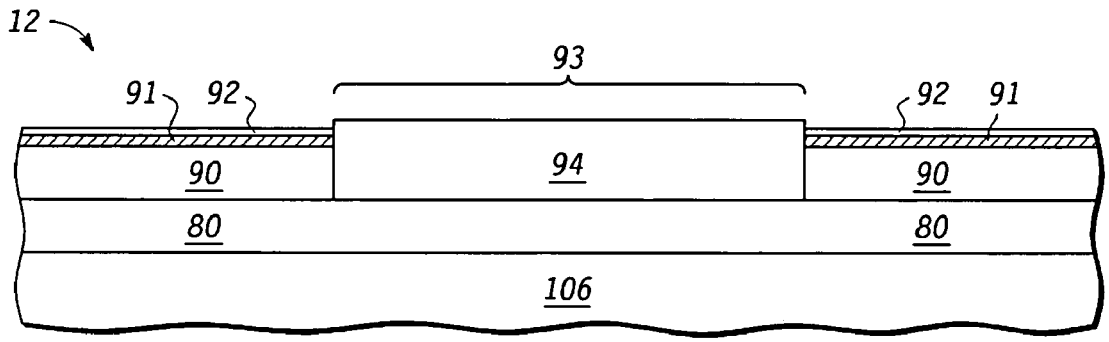
FIG. 5 illustrates processing subsequent to FIG. 4 where portions of the first oxide layer, the first nitride layer and an SOI semiconductor layer have been removed and replaced with a deposited oxide layer.

FIG. 5 illustrates processing of a semiconductor wafer structure 12 subsequent to FIG. 4 where portions of the first oxide layer 91, the first nitride layer 92 and the second semiconductor layer 90 have been removed and replaced with a deposited and polished oxide layer 94. In particular, after forming the first oxide layer 91 and nitride layer 92, a mask layer (not shown) may optionally be formed on an exposed upper surface of the nitride layer 92. Using the oxide layer 91 and nitride layer 92 (and optional mask layer), conventional patterning and anisotropic etching techniques may be used to form an opening 93 through the second semiconductor layer 90. In this opening 93, an oxide layer 94 is formed to replace the second semiconductor layer 90 in the opening 93 by depositing an overlying layer of oxide and then polishing the oxide back to level with the mask layers 91, 92 (as shown in FIG. 5) or back to the level of the second semiconductor layer 90 (not shown).

Figure 6:
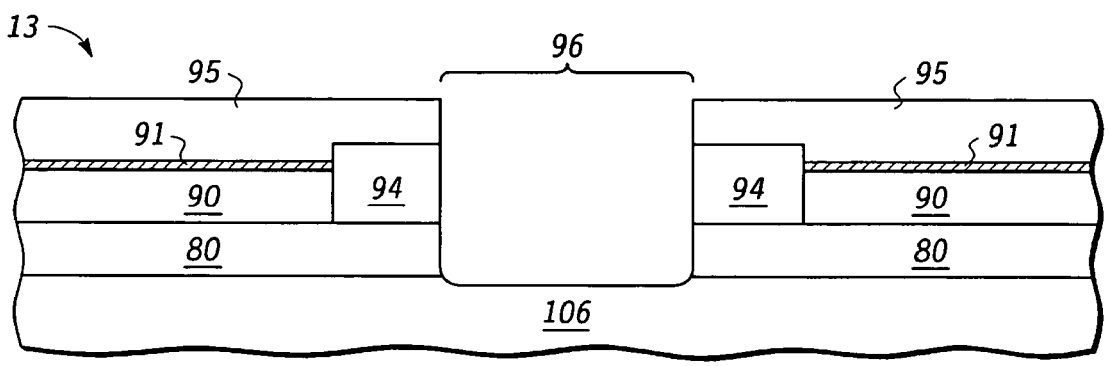
FIG. 6 illustrates processing subsequent to FIG. 5 after the first nitride layer is removed and a second nitride layer is formed over the wafer structure, and portions of the second nitride layer, deposited oxide layer and a buried oxide layer have been etched or removed to form an opening.

FIG. 6 illustrates processing of a semiconductor wafer structure 13 subsequent to FIG. 5 after the first nitride layer 92 is removed and a second nitride or hardmask layer 95 is formed over the wafer structure, and portions of the second nitride layer 95, deposited oxide layer 94 and a buried oxide layer 80 have been etched or removed by patterning and etching to remove an exposed portion of the oxide layer 94 and insulator layer 80, thereby forming a second etch opening 96 to the exposed first semiconductor layer 106. The pattern transfer and etching of the mask layer may use one or more etching steps to selectively remove the unprotected portions of the oxide layers 94, 80, including a dry etching process such as reactive-ion etching, ion beam etching, plasma etching or laser etching, a wet etching process wherein a chemical etchant is employed or any combination thereof.

The opening 96 is used to define and differentiate active regions for first and second types of MOS devices subsequently formed on the wafer structure 13. For example, the unetched portions of the second semiconductor layer 90 define a first device region for a first type of MOS device, while the portions of the first semiconductor layer 106 that is exposed by the opening 96 (and that is subsequently epitaxially regrown, as described hereinbelow) defines a second device region for a second type of MOS device. To this end, the unetched portions of the oxide layer 94 may be used to form at least part of the shallow trench isolation regions for electrically and physically isolating the first and second device regions from one another by designing the width and placement of the second etch opening 96 to be smaller than the width of the first etch opening 93, and preferably centered around the first etch opening 93.

Figure 7:
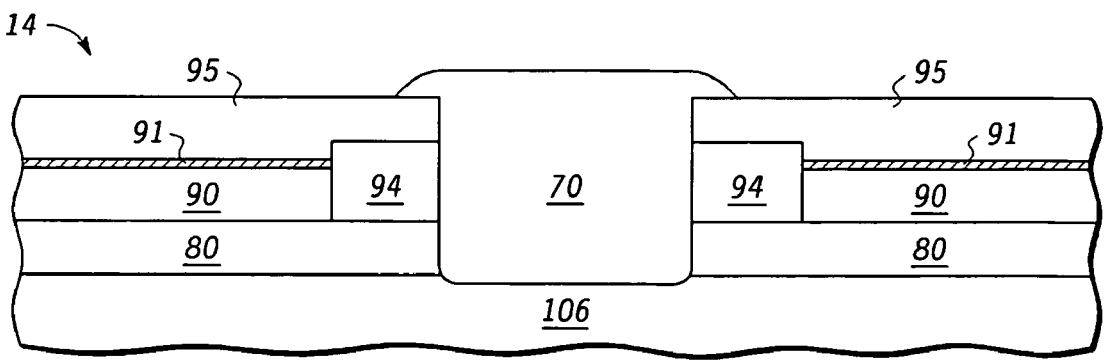
FIG. 7 illustrates processing subsequent to FIG. 6 after an epitaxial semiconductor layer is selectively formed to partially or completely fill the opening.

Turning now to FIG. 7, processing of a semiconductor wafer structure 14 subsequent to FIG. 6 is illustrated to show formation of a selective epitaxial silicon layer 70 to partially or completely fill the opening 96 so that it is higher than the second semiconductor layer 90 and/or the mask layers 91, 95. As described herein and understood by those skilled in the art, the process of forming an epitaxial layer may be described as either depositing or growing a layer so that the "growth" and "deposition" terms are used interchangeably in this respect. By selectively forming the semiconductor layer 70 so that its crystallographic orientation is different from the crystallographic orientation of the second semiconductor layer 90, the mobility of the holes and electrons for subsequently formed PMOS and NMOS devices, respectively, may be optimized. Since the regrown semiconductor layer 70 is epitaxially grown from the first semiconductor layer 106, they will have the same crystallographic orientations, though the layers 70, 106 can be formed of different semiconductor materials. Depending on the type of transistor device being fabricated, the semiconductor layer 70 may be formed from any (doped or undoped) semiconductor material, such as Si, SiGe, SiC, SiGeC or combinations thereof, which is capable of being formed utilizing a selective epitaxial growth method. Selected embodiments of the present invention also contemplate using strained or compressed materials to further enhance mobility. For example, if PMOS devices are formed over the semiconductor layer 70, the semiconductor layer 70 may be formed by epitaxially growing silicon having a crystallographic orientation (e.g., (110)) that is the same as the crystallographic orientation of the first semiconductor layer 106. This epitaxial growth may be achieved by heating the semiconductor wafer structure 13 to a temperature between 500 and 900° C. in the presence of dichlorosilane, HCL and hydrogen gas. Alternatively, if NMOS devices are formed over the semiconductor layer 70, at least a portion of the epitaxially grown layer 70 may be formed by epitaxially growing silicon having a (100) crystallographic orientation. In this case, the second semiconductor layer would have a (110) crystallographic orientation, and the PMOS device would be built on this layer. By optimizing the crystallographic orientations of the layers 70, 106 (e.g., so that the epitaxially grown layer 70, or "epi-layer," is formed of (110) semiconductor material and the second semiconductor layer 90 is formed of (100) semiconductor material), significant mobility improvements are obtained over single-orientation substrates—up to 2.5× improvement for hole mobility in PMOS devices formed over silicon dioxide gate layers. In addition, by completely filling the trench opening 96 with an epitaxial semiconductor layer 70 that grows above and over the nitride mask layer 95, crystalline defectivity in the trench opening 96 is reduced or minimized. It will be appreciated that, when the epi layer 70 is formed with n-type material, the second semiconductor layer 90 in the SOI region may be formed of depositing strained p-type semiconductor material having a second crystal orientation that is different from the first crystal orientation.

Figure 8:
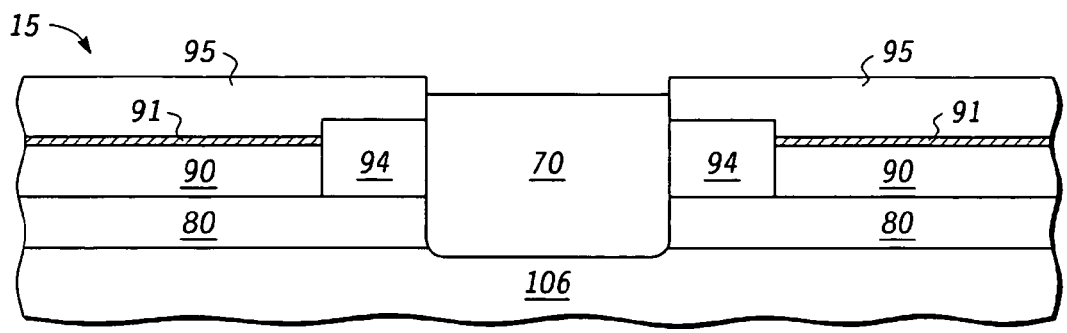
FIG. 8 illustrates processing subsequent to FIG. 7 after a polish of the epi semiconductor layer.

FIG. 8 illustrates processing of a semiconductor wafer structure 15 subsequent to FIG. 7 after an optional polishing and/or etching of the epi semiconductor layer 70. Chemical mechanical polishing or any desired etchant process may be used to polish epi semiconductor layer 70, including dry etching, wet etching or oxidation of silicon and then stripping away the oxide. As illustrated, the upper surface of the polished epi semiconductor layer 70 is recessed below the hardmask layer 95, but is higher than the underlying SOI layer 90, though other etch heights may be obtained. In accordance with various embodiments, the polishing step may be skipped if the upper surface of the epitaxially grown semiconductor layer 70 is not significantly higher than the upper surface of the hardmask layer 95.

Figure 9:
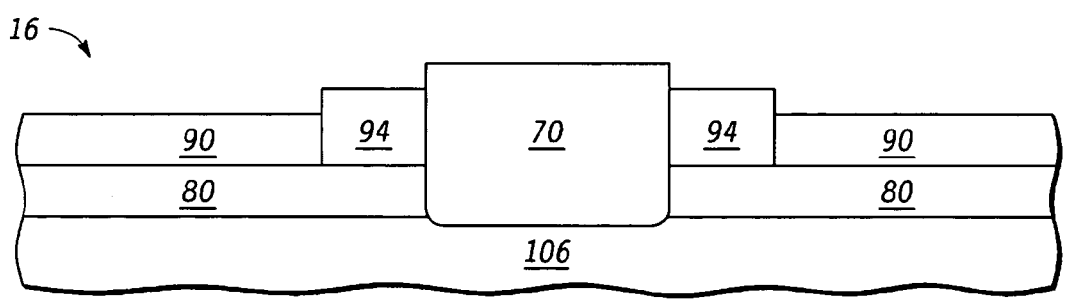
FIG. 9 illustrates processing subsequent to FIG. 8 after the remaining second nitride layer and pad oxide is stripped.

FIG. 9 illustrates processing of a semiconductor wafer structure 16 subsequent to FIG. 8 after the remaining nitride mask layer 95 and any oxide layer 91 (depicted in FIG. 8) are stripped. The removal of the nitride mask layer 95 and oxide layer 91 exposes the steps between the SOI semiconductor layer 90, the shallow trench isolation regions 94, and the epi semiconductor layer 70. Any desired stripping process may be used that is capable of selectively removing the patterned nitride mask layers 95 from the structure 16, and the pad oxide layer 91 may also be optionally removed with an appropriate oxide etch process. In accordance with various embodiments, the nitride/oxide stripping step may be skipped, though this will prevent crystalline silicon from growing on the SOI semiconductor layer 90 (as described herein below), in which case a blanket silicon deposition can be used to form polycrystalline on the remaining nitride/oxide layer(s) over the SOI.

Figure 10:
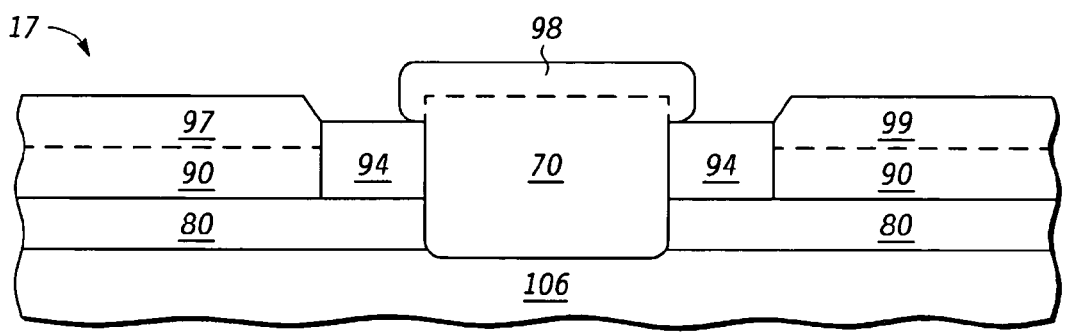
FIG. 10 illustrates processing subsequent to FIG. 9 after selective deposition of silicon increases the thickness of the epi semiconductor layer and the SOI semiconductor layer.

FIG. 10 illustrates processing of a semiconductor wafer structure 17 subsequent to FIG. 9 after selective deposition of silicon forms layers of crystalline silicon 97, 99 to increase the thickness of the SOI semiconductor layers 90. This same process simultaneously forms a crystalline silicon layer 98 to increase the thickness of the epi semiconductor layer 70 so that its upper surface is above the STI region 94. Selective silicon deposition may be achieved by heating the semiconductor wafer structure 17 to a temperature between 500 and 900° C. in the presence of dichlorosilane, HCL and hydrogen gas, and is used to prevent poly/epi dislocations from entering into the trench regions. When the SOI semiconductor layer 90 is formed with a (100) crystallographic orientation, it will have a higher deposition rate than an epi semiconductor layer 70 formed with a (110) silicon, thereby increasing the thickness of the SOI semiconductor layer 90 relative to the epi semiconductor layer 70. In accordance with various embodiments, the selective silicon deposition step may be skipped, in which case a blanket silicon deposition can be used to cover the wafer structure with a nearly uniform thickness of silicon and polysilicon over the dual substrate areas, as described hereinbelow.

Figure 11:
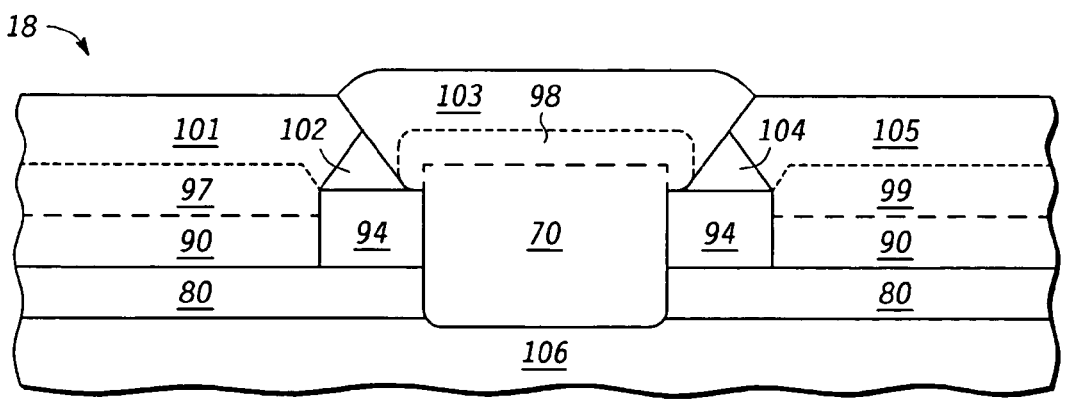
FIG. 11 illustrates processing subsequent to FIG. 10 after blanket silicon deposition increases the thickness of the epi semiconductor layer and the SOI semiconductor layer by forming layers of silicon and polysilicon at substantially uniform heights over the semiconductor wafer structure.

FIG. 11 illustrates processing of a semiconductor wafer structure 18 subsequent to FIG. 10 after blanket silicon deposition increases the thickness of the epi semiconductor layers and the SOI semiconductor layers by forming layers of crystalline silicon and polysilicon at substantially uniform heights over the semiconductor wafer structure. In particular, a nonselective silicon deposition step forms polysilicon layers 102, 104 over the shallow trench isolation regions 94. In addition, the nonselective silicon deposition step forms crystalline silicon 101, 105 with an orientation equivalent to the SOI 90 over the SOI semiconductor layers 90, 97, 99, and simultaneously forms crystalline silicon 103 with an orientation equivalent to the substrate 106 over the epi semiconductor layer 70, 98. This non-selective formation of silicon layers 101-105 may be achieved by heating the semiconductor wafer structure 18 to a temperature between 500 and 900° C. in the presence of dichlorosilane, silane or other silicon precursor, and hydrogen gas. In a selected embodiment, the polysilicon layers 102, 104 are between 100-3000 Angstroms thick, the crystalline layers 101, 105 are between 100-5000 Angstroms thick, and the crystalline silicon layer 103 is between 100-5000 Angstroms thick. When the SOI semiconductor layer 90 is formed with a (100) crystallographic orientation, it will have a higher deposition rate than an epi semiconductor layer 70 formed with a (110) silicon, thereby increasing the thickness of the SOI semiconductor layer 90 relative to the epi semiconductor layer 70. As a result, the entire wafer is covered with a nearly uniform thickness of silicon and polysilicon over the dual substrate areas.

Figure 12:
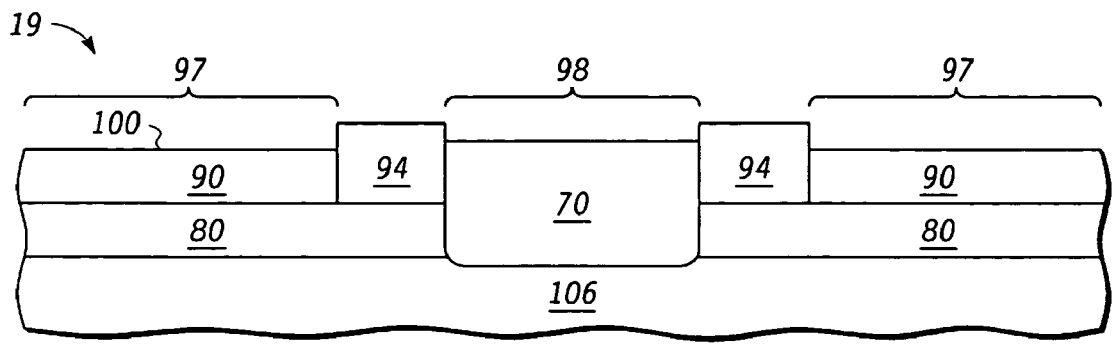
FIG. 12 illustrates processing subsequent to FIG. 11 after CMP polishing of the semiconductor wafer structure.

FIG. 12 illustrates processing of a semiconductor wafer structure 19 subsequent to FIG. 11 after CMP polishing of the wafer structure. In accordance with various embodiments of the present invention, the presence of the additional polysilicon layers 102, 104 (shown in FIG. 11) increases the temperature of the pad when subsequent CMP polishing occurs, resulting in a higher polish rate and reduced polish times due to the elevated polishing temperature. In addition, the nearly planar blanket area of crystalline silicon layers 101, 103, 105 reduces post-polish variation between large and small features in isolated and dense areas. Chemical mechanical polishing or any desired etchant process may be used to polish the epi semiconductor layers (e.g., 70, 98, 103), the SOI semiconductor layers (e.g., 90, 97, 99, 101, 105), and polysilicon layers (e.g., 102, 104), including dry etching, wet etching or oxidation of silicon. As a result, a dual substrate structure having a substantially coplanar surface 100 is obtained by polishing and/or etching the semiconductor layer 70 back to the same level as the second semiconductor layer 90. Of course, the semiconductor layer 70 may be polished or etched back to a lesser or greater extent, but in any case is substantially coplanar with the second semiconductor layer 90 to facilitate CMOS processing. In a selected embodiment, the surfaces of the SOI semiconductor layer 90 and the epi semiconductor layer 70 have the same step/recess from the STI region 94.

As a result of the foregoing steps, shallow trench isolations regions formed from the unetched oxide layer 94 serve to provide electrical and physical isolation between transistor devices in the first semiconductor active device region 97 and transistor devices in the second semiconductor active device region 98. It will be appreciated that isolation regions may also be formed as field oxide regions or isolation dielectric trenches using any desired process. For example, isolation regions comprised of a silicon-oxide (or other dielectric) compound may be formed by defining trench areas with mask and patterning steps, etching trenches in selected portions of the layers 90, 80, 106, filling the trenches with a deposited dielectric, and polishing or etching the wafer to remove the excess dielectric. Alternatively, isolation dielectric trenches may be formed using conventional LOCOS processing in which silicon nitride is deposited and patterned to define the isolation regions and, thereafter, the exposed silicon of wafer structure 16 is thermally oxidized to form the isolation dielectric.

Figure 13:
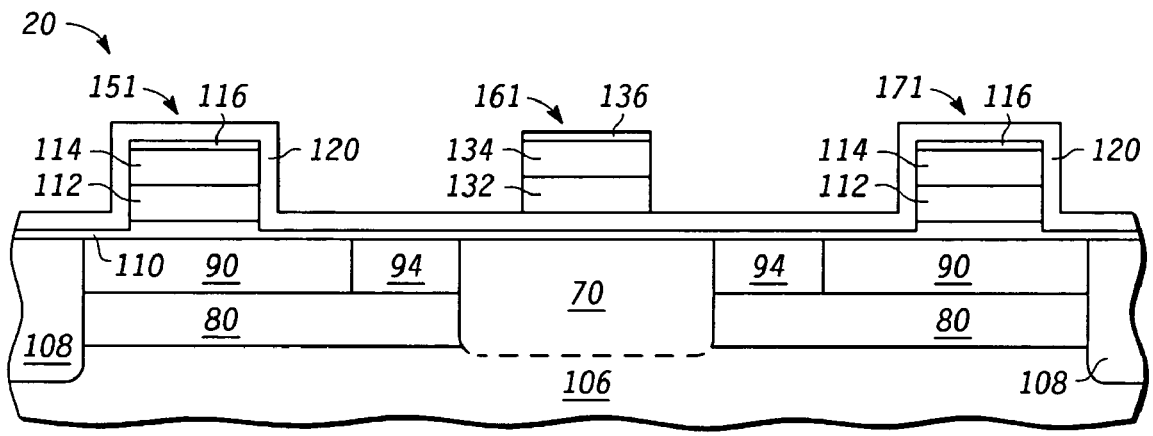
FIG. 13 illustrates processing subsequent to FIG. 12 in which first and second gate electrodes are partially formed with one or more high-k gate dielectric layers.

FIG. 13 illustrates processing of a semiconductor wafer structure 20 subsequent to FIG. 12 in which first and second gate electrodes are partially formed with one or more high-k gate dielectric layers to provide a high performance CMOS device. Of course, it will be appreciated that such advanced gate features are not required, and the planarized dual substrate wafer could also be integrated with other dielectric materials (such as silicon dioxide) and gate structures (such as polysilicon gates). In the implementation depicted in FIG. 13, PMOS and NMOS devices may be formed on the exposed semiconductor layers (i.e., second semiconductor layer 90 and epi semiconductor layer 70), which may include well regions (not shown) in each layer 70, 90. Specifically, a first semiconductor device 151 is an NMOS device formed on a portion of the second conductive layer 90 in the SOI region, and a second semiconductor device 161 is a PMOS device formed on a portion of the second epi semiconductor layer 70. Alternatively, the first semiconductor device 151 may be a PMOS device and the second semiconductor device 161 may be an NMOS device. The allocation of device types to device regions preferably exploits the differing crystal orientation of the underlying layers 70, 90, to provide a high performance CMOS device where the PMOS device has improved hole mobility. This may be accomplished, for example, by forming the PMOS devices over the semiconductor material that has a (110) or (111) orientation, whereas the NMOS devices are formed over a semiconductor surface having a (100) orientation. In addition, the hole mobility of the PMOS devices may be further improved by forming the PMOS gate electrodes over a layer of compressed silicon germanium having a (110) orientation.

In the semiconductor wafer structure 20 depicted in FIG. 13, a dual gate integrated circuit device formed with a CMOS fabrication process is illustrated where at least one gate electrode is formed over one or more relatively high-k gate dielectric layers. As will be appreciated, a relatively high-k dielectric is a dielectric having a dielectric constant that is higher than (e.g., at least 1.5 times) the dielectric constant of $SiO_2$. The depicted wafer structure 20 includes a first SOI semiconductor layer 90—in which may be formed a first well region (not shown)—and a second epi-layer 70—in which may be formed a second well region (not shown)—that are laterally displaced with respect to one another. The first and second well regions contain impurities such that one of the wells is a p-doped well and one of the wells is an n-doped well. In the described embodiment, the first well in the SOI layer 90 is a p-doped well (p-well) in which NMOS transistors are formed, and the second well in the epi-layer 70 is an n-doped well (n-well) in which PMOS transistors are formed.

Following the formation of wells and isolation trenches, at least a first gate dielectric layer 110 is blanket deposited across the entire wafer structure 20. The first dielectric layer may be used to form at least part of the gate dielectric for all transistors on the wafer, or alternatively, the first dielectric layer may be used for only a first type of transistor formed on the wafer. In the depicted embodiment, the first dielectric layer 110 will serve as at least part of the gate dielectric for all transistors formed on the wafer structure 20. In an embodiment in which the first well in the SOI layer 90 is a (100)-oriented p-well region and the second well in the epi-layer 70 is a (110)-oriented n-well region, at least part of the first gate dielectric layer 110 is used as at least part of the gate dielectric in the NMOS and PMOS transistors. In one such implementation, first dielectric layer 110 is a metal-oxide compound formed by chemical vapor deposition or by atomic layer deposition having a typical final thickness is in the range of 0.1-10 nanometers. A suitable metal oxide compound for use as first dielectric layer 110 is hafnium oxide (preferably $HfO_2$), though other oxides, silicates or aluminates of zirconium, aluminum, lanthanum, strontium, titanium and combinations thereof may also be used, including but not limited to $Ta_2O_5$, $ZrO_2$, $HfO_2$, $TiO_2$, $Al_2O_3$, $Y_2O_3$, $La_2O_3$, $HfSiO_x$, $ZrSiO_x$, $LaSiO_x$, $YSiO_x$, $ScSiO_x$, $CeSiO_x$, $HfLaSiO_x$, $HfAlO_x$, $ZrAlO_x$, and $LaAlO_x$. In addition, multi-metallic oxides (for example barium strontium titanate, BST) may also provide high-k dielectric properties.

After forming the first dielectric layer 110, one or more first gate electrodes 151, 171 are formed above first SOI semiconductor layer 90 using a metal gate electrode formation sequence. For example, the gate electrode 151 may be formed from a single conductive layer or by sequentially depositing or forming a first gate layer 112, a second conductive layer 114, and a third gate layer 116 over the first dielectric layer 110 to form a first gate stack. In one embodiment, the first gate layer 112 is a TaSiN layer having a thickness in the range of 1-20 nanometers, though other gate layer materials may be used, such as polysilicon, SiGe, other silicon-based materials or a metal-based layer. In another embodiment, the first gate layer 112 is a TaC or $TaC_xN_y$ layer having a thickness in the range of 1-100 nanometers. The conductive layer 114 is an optional layer that may be used, for example, to simplify integration issues. Conductive layer 114 may be a heavily doped polysilicon, tungsten, or another suitable electrically conductive material having a thickness in the range of approximately 10-100 nanometers. Layer 116 may be another metal or may be a conducting or non-conducting layer. Once the first gate stack is formed, conventional gate electrode etch processing steps may be used to form the desired gate electrode 151 and/or to clear or partially etch the remaining exposed portions of the first gate dielectric layer 110.

Following formation of the first gate electrodes 151, 171, a second gate dielectric layer 120 may optionally be formed over wafer structure 20, such as by using conventional chemical vapor deposition, oxide growth or atomic layer deposition techniques. The second gate dielectric layer 120 may be a different material than first gate dielectric 110 and the thickness of the second gate dielectric 120 over the second epi layer 70 may be different than the thickness of first gate dielectric 110 over first SOI semiconductor layer 90. Either or both of the first gate dielectric layer 110 and the second gate dielectric layer 120 are high-k dielectrics. As will be appreciated, a high-k dielectric is a dielectric having a dielectric constant that is at least 1.5 times the dielectric constant of $SiO_2$. In an embodiment suitable for its use in conjunction with PMOS transistors (such as those formed with TiN, MoON, MoN, $IrO_x$, $ReO_x$, $RuO_x$, Ti, Ta, $W_2N$, etc.) having a gate electrode, the second gate dielectric 120 serves as a gate dielectric cap layer for the PMOS transistor devices, and may be implemented as an atomic layer deposited (ALD) dielectric film (e.g., $Al_2O_3$) having a thickness in the range of 0.5-10 nanometers. Although the second gate dielectric layer 120 is depicted in FIG. 13 as being formed on the remaining, unetched portion of the first gate dielectric 110 over the second epi layer 70, it will be appreciated that the second gate dielectric layer 120 may also be formed on the surface of the second epi layer 70 when the first gate dielectric layer 110 has been cleared entirely from the exposed portions of the wafer surface.

After formation of the first gate electrodes 151, 171 and second gate dielectric 120, a second gate electrode 161 is formed above second epi layer 70 using a metal gate electrode formation sequence. For example, the gate electrode 161 may be formed from a single conductive layer or by sequentially depositing or forming a first gate layer 132, a second conductive layer 134, and a third gate layer 136 over the second dielectric layer 120 to form a second gate stack which is etched to form the second gate electrode 161. In one embodiment, the first gate layer 132 is a TiN layer having a thickness in the range of 1-100 nanometers. When the second gate electrode 161 is formed separately from the first gate electrode using a single conductive layer or a sequence of layers 132, 134, 136 formed over the second epi layer 70, the composition and thickness of the second gate electrode 161 may be equivalent to or different from the composition and thickness of the first gate electrode 151. Whatever the composition and thickness of the first and second gate electrodes, the gate dielectric layers under the first and second gate electrodes may advantageously be formed to have an equivalent electrical thickness.

Figure 14:
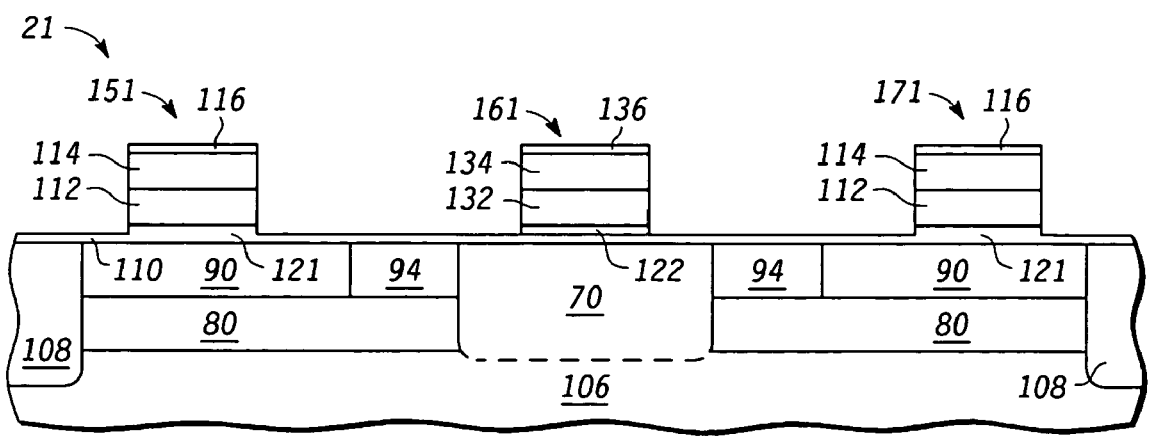
FIG. 14 illustrates processing subsequent to FIG. 13 after selective removal of a gate dielectric from the gate electrodes.

Referring to FIG. 14, a selective and controlled etch process may be used to remove at least a thin layer from any exposed portion of the second gate dielectric layer 120. At the conclusion of the etching process, a remnant portion 122 of the second gate dielectric layer 120 under the second gate electrode 161 remains to form all or part of the gate dielectric for the second gate electrode 161, while the remnant portion 121 of the first gate dielectric for the first gate electrode 151 is formed entirely from the first gate dielectric layer 110.

It will be appreciated that additional processing steps will be used to complete the fabrication of first and second gate electrodes into transistors. As examples, one or more sacrificial oxide formation, stripping, isolation region formation, well region formation, extension implant, halo implant, spacer formation, source/drain implant, heat drive or anneal steps, and polishing steps may be performed, along with conventional backend processing (not depicted), typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

It will also be appreciated that other semiconductor processing sequences may be used to fabricate hybrid substrates having substantially uniform dual substrate surface heights by thickening an SOI semiconductor layer in relation to an epitaxial or DSO semiconductor layer. For example, the SOI semiconductor layer may be thickened with a selective silicon deposition process prior to formation of an epi semiconductor layer, thereby obtaining substantially planar dual surface orientation areas. Once the SOI semiconductor layer is thickened, a DSO hardmask is deposited for use in etching a trench for the second or DSO substrate. After the second silicon orientation has been created, the DSO hardmask is removed and a CMP planarization is completed to achieve matching surface heights.

Figure 15:
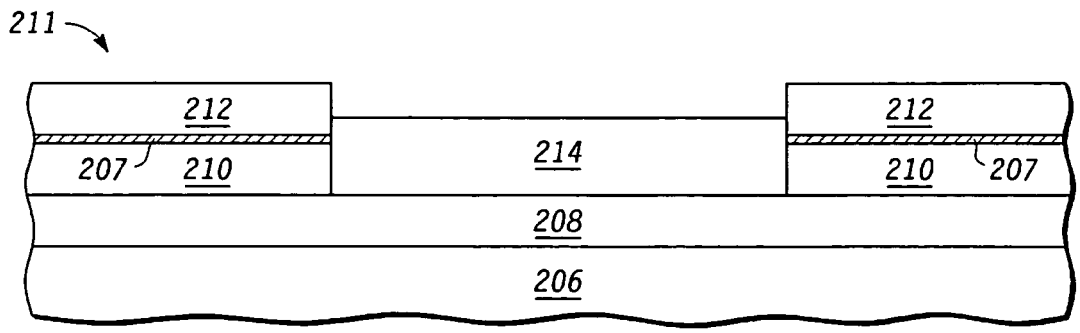
FIG. 15 is a partial cross-sectional view of a semiconductor wafer structure having a first nitride layer, pad oxide layer and isolated SOI layers formed over a semiconductor substrate in accordance with another exemplary embodiment where the SOI semiconductor layer is thickened prior to formation of an epi semiconductor layer.

An example of such an alternative processing sequence is depicted beginning with FIG. 15 which illustrates a partial cross-sectional view of a semiconductor structure 211 in which isolated SOI layers 208, 210 are formed over a semiconductor substrate layer 206 and electrically isolated from one another by shallow trench isolation regions 214. As depicted in FIG. 15, the SOI layers include an insulator layer 208 which is formed on the first semiconductor substrate layer 206 and which will ultimately be used to form the buried oxide (BOX) layer for silicon-on-insulator devices. The SOI layers also include a second semiconductor layer 210 formed of a semiconductor material which has a crystallographic orientation which is different from the crystallographic orientation of the first semiconductor substrate layer 206. In addition, a first oxide layer 207 (e.g., a pad oxide) and nitride or mask layer 212, which were used to form the shallow trench isolation regions 214, remain on the second semiconductor layer 210.

Figure 16:
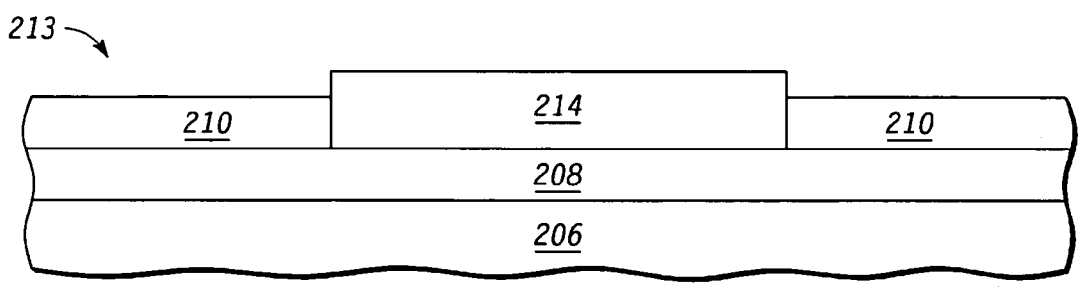
FIG. 16 illustrates processing subsequent to FIG. 15 after the pad oxide and first nitride hardmask are stripped.

FIG. 16 illustrates processing of a semiconductor structure 213 subsequent to FIG. 15 after the first hardmask layer 212 and oxide layers 207 are stripped. Any desired stripping process may be used that is capable of selectively removing the patterned nitride or mask layer 212 from the structure 213, and the oxide layer 207 may also be removed with an appropriate oxide etch process.

Figure 17:
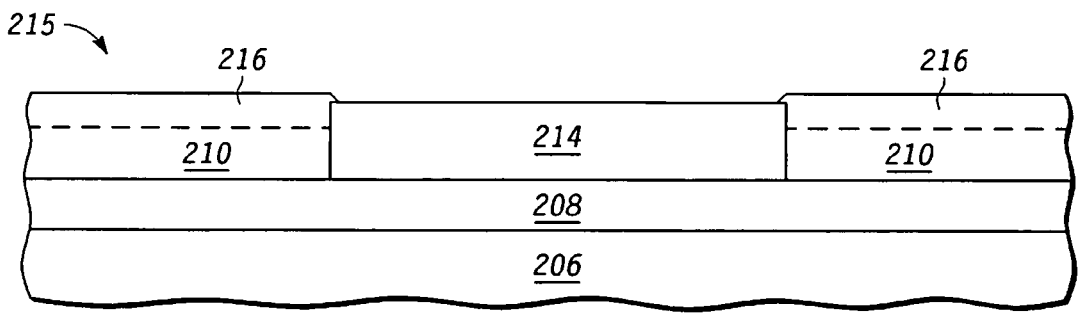
FIG. 17 illustrates processing subsequent to FIG. 16 after selective deposition of silicon increases the thickness of the SOI semiconductor layer.

FIG. 17 illustrates processing of a semiconductor structure 215 subsequent to FIG. 16 after selective deposition of silicon forms layers of crystalline silicon 216 to increase the thickness of the SOI semiconductor layers 210. Selective silicon deposition may be achieved by heating the semiconductor structure 215 to a temperature between 500 and 900° C. in the presence of dichlorosilane, HCL and hydrogen gas, and is used to increase the thickness of the SOI semiconductor layer 210 relative to the upper surface of the STI regions 214.

Figure 18:
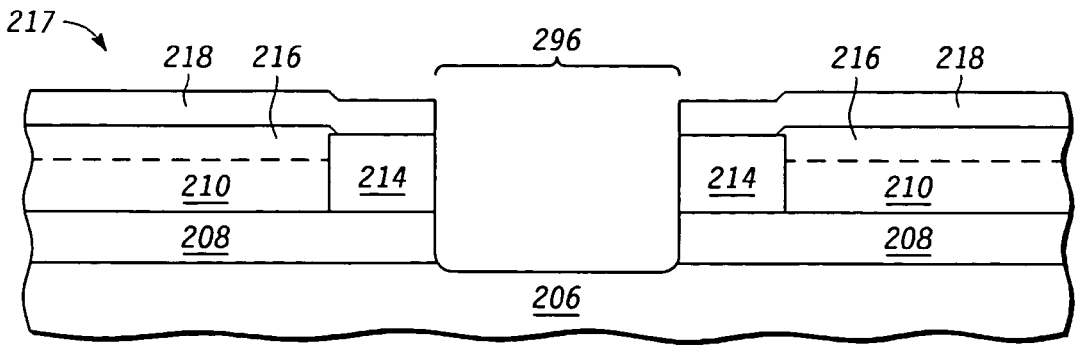
FIG. 18 illustrates processing subsequent to FIG. 17 after forming a second pad oxide and second nitride mask layer and etching the wafer structure to form an opening to a semiconductor substrate layer by removing portions of the SOI semiconductor layer and buried oxide layer.

FIG. 18 illustrates processing of a semiconductor structure 217 subsequent to FIG. 17 after forming a second nitride hardmask and pad oxide layer 218 and etching the semiconductor structure to form a trench opening 296 to a semiconductor substrate layer 206 by removing portions of the shallow trench isolation region 214 and buried oxide layer 208. The pattern transfer and etching of the mask layer 218 may use one or more etching steps to selectively remove the unprotected portions of the shallow trench isolation region 214 and buried oxide layer 208, including a dry etching process such as reactive-ion etching, ion beam etching, plasma etching or laser etching, a wet etching process wherein a chemical etchant is employed or any combination thereof.

Figure 19:
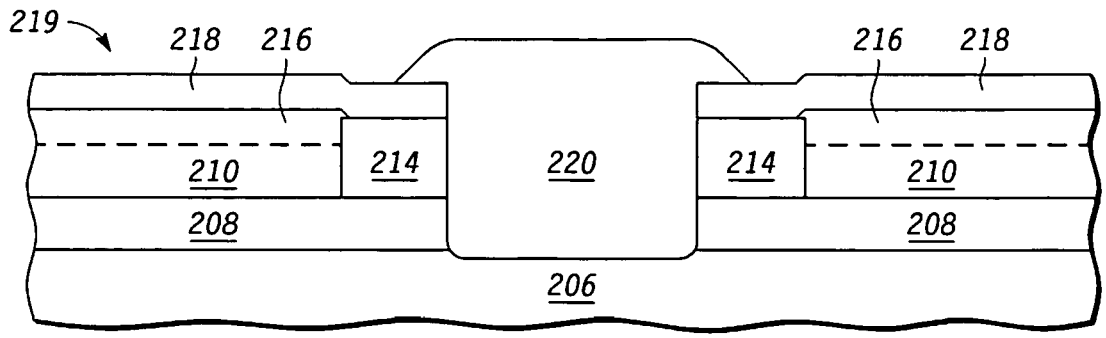
FIG. 19 illustrates processing subsequent to FIG. 18 after a epitaxial semiconductor layer is selective formed to partially or completely fill the opening.

FIG. 19 illustrates processing of a semiconductor structure 219 subsequent to FIG. 18 after a selective epitaxial semiconductor layer 220 is formed to partially or completely fill the trench opening 296 so that it is higher than the SOI semiconductor layer 210, 216 and/or the mask layers 218. As explained above, by selectively forming the epi semiconductor layer 220 so that its crystallographic orientation matches the orientation of the substrate semiconductor layer 206 but differs from the crystallographic orientation of the SOI semiconductor layer 210, 216, the mobility of the holes and electrons for subsequently formed PMOS and NMOS devices may be optimized.

Figure 20:
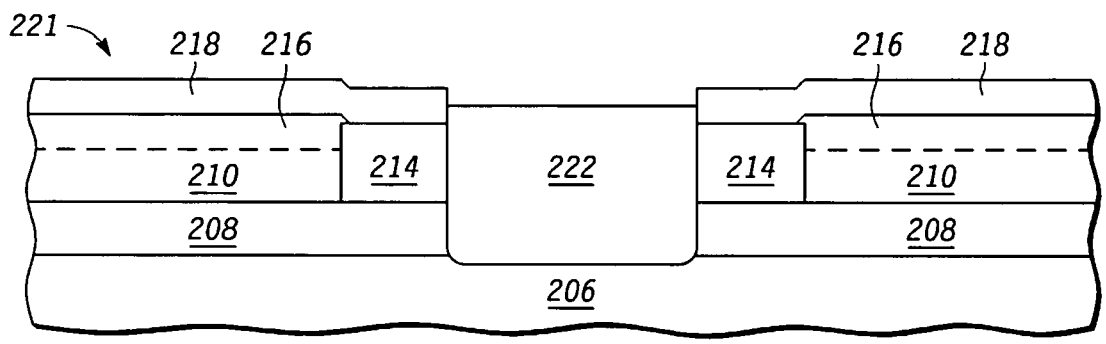
FIG. 20 illustrates processing subsequent to FIG. 19 after a polish of the epi semiconductor layer into substantial co-planarity with the SOI semiconductor layer.

FIG. 20 illustrates processing of a semiconductor structure 221 subsequent to FIG. 19 after the epi semiconductor layer 222 is polished and/or etched into substantial coplanarity with the SOI semiconductor layer 210, 216 (which is still covered by the mask layer 218). Any desired chemical mechanical polishing or etchant process may be used to polish the epi semiconductor layer 222, including dry etching, wet etching or oxidation of silicon and then stripping away the oxide. Optionally this first polish step may be skipped and the hardmask stripped without prior CMP polishing.

Figure 21:
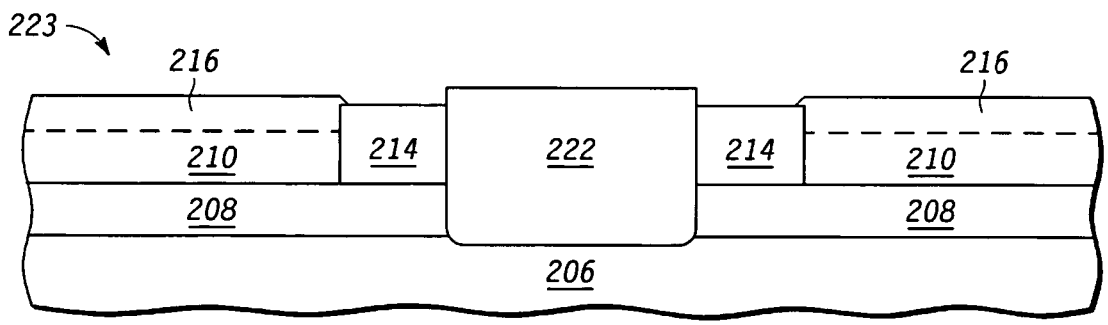
FIG. 21 illustrates processing subsequent to FIG. 20 after the remaining nitride mask and pad oxide layers have been stripped.

FIG. 21 illustrates processing of a semiconductor structure 223 subsequent to FIG. 20 after the remaining hardmask layer 218 is stripped. Any desired stripping process may be used that is capable of selectively removing the patterned nitride or mask layer 218 from the structure 223.

Figure 22:
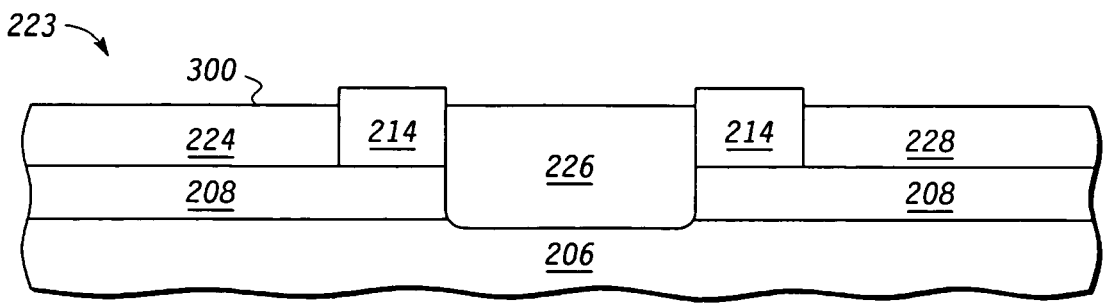
FIG. 22 illustrates processing subsequent to FIG. 21 after CMP polishing of the semiconductor wafer structure.

FIG. 22 illustrates processing of a semiconductor structure 225 subsequent to FIG. 21 after CMP polishing of the semiconductor structure. Again, any desired chemical mechanical polishing or etchant process may be used to polish the epi semiconductor layer 226 and SOI semiconductor layers 224, 228, thereby providing a dual surface structure having a substantially coplanar surface 300 for facilitating subsequent CMOS processing. In a selected embodiment, the surfaces of the SOI semiconductor layer 224, 228 and the epi semiconductor layer 226 have the same step/recess from the STI regions 214.

In one form there is provided herein a method for fabricating a dual surface semiconductor structure by forming a first semiconductor layer having a first crystal orientation, and then forming a second semiconductor layer (e.g., (100) p-type silicon or (110) p-type silicon) and an adjacent isolation region over at least part of the first semiconductor layer, where the second semiconductor layer has a second, different crystal orientation and is electrically isolated from the first semiconductor layer (e.g., by a buried oxide layer). A trench opening that exposes the first semiconductor layer is formed and at least partially filled by epitaxially growing a first epitaxial semiconductor material on an exposed surface of the first semiconductor layer with a selective silicon growth step to form an first epitaxial semiconductor layer (e.g., (110) n-type silicon or (100) n-type silicon) that is higher than the isolation region. Either before, during or after epitaxially growing the first epitaxial semiconductor material, a second epitaxial semiconductor material is grown on an exposed surface of the second semiconductor layer with an epitaxial silicon deposition process to form a crystalline silicon layer to thicken the second semiconductor layer in a first circuit area so that the second semiconductor layer is higher than the isolation region. In a selected implementation, the trench opening is formed after thickening the second semiconductor layer by patterning and etching a mask layer on the second semiconductor layer and a portion of the isolation region to form an opening through the isolation region and to the first semiconductor layer. The trench opening may then be completely filled by epitaxially growing a first epitaxial semiconductor material to form a first epitaxial semiconductor layer in a second circuit area that is higher than the isolation region. The first epitaxial semiconductor layer may then be optionally polished below the mask layer and above the isolation region before stripping the mask layer and optionally polishing the structure further. After the polishing and/or etching the first epitaxial semiconductor layer so that it is substantially coplanar with the second semiconductor layer, a first gate electrode structure (including a first relatively high-k dielectric gate layer and a first conductive layer) may be formed over the epi semiconductor silicon layer, while a second gate electrode structure (including a second relatively high-k dielectric gate layer and a second conductive layer) may be formed over the second semiconductor layer.

In another form, a method of forming an integrated circuit structure is provided whereby a first semiconductor layer having a first crystal orientation is formed, and then a second semiconductor layer (having a second, different crystal orientation) and an adjacent isolation region are formed over the first semiconductor layer and electrically isolated therefrom by a buried insulator layer. Subsequently, part of the isolation region is etched to expose the first semiconductor layer, and an epitaxial semiconductor material having the first crystal orientation is grown on an exposed surface of the first semiconductor layer to form a first epitaxial semiconductor layer that is higher than the isolation region. Before, during or after growing the first epitaxial semiconductor layer, a second epitaxial semiconductor material is grown on an exposed surface of the second semiconductor layer to thicken the second semiconductor layer so that the second semiconductor layer is higher than the isolation region. When (100) n-type silicon is used for the first semiconductor layer and (110) p-type silicon is used for the second semiconductor layer, the second epitaxial semiconductor material will have a higher deposition rate than the first epitaxial semiconductor material. As a result, the first epitaxial semiconductor layer and second semiconductor layer may be polished until they are substantially coplanar.

In yet another form, there is provided a method for fabricating a semiconductor structure having planar dual-surface orientation substrates by forming first and second semiconductor substrates that are electrically isolated from each other by at least a first isolation region, where the first semiconductor substrate has a first crystallographic orientation and where the second semiconductor substrate has a second crystallographic orientation that is different from the first crystallographic orientation. Under the method, silicon is blanket deposited on exposed surfaces of the first and second semiconductor substrates. This results in a first epitaxial semiconductor layer being formed on an exposed surface of the first semiconductor substrate that is higher than the first isolation region. In addition, this results in a second epitaxial semiconductor layer being formed on an exposed surface of the second semiconductor substrate that is higher than the first isolation region. With the elevated surface heights, the first and second epitaxial semiconductor layers may be polished down to at least the first isolation region so that the first epitaxial semiconductor layer is substantially coplanar with the second epitaxial semiconductor layer.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, an alternative to the device structure shown in FIG. 13 is for first well (not shown) in the layer 90 to be an n-doped well and the second well (not shown) in the layer 70 to be p-doped. Also the first gate layers (112, 132) and the second conductive layers (114, 134) may be different materials than those disclosed. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. For example, the disclosed semiconductor manufacturing processes improve the post-CMP substrate surface planarity in a Dual-Surface Orientation (DSO) integration to reduce or eliminate the process and performance limitations associated with non-uniform substrate heights. In selected embodiments, photo control is improved by planarizing the dual substrate surfaces. In other embodiments, by improving substrate uniformity/planarity of the structures across a wafer with structures of varying sizes and density, dispersion in device parametrics and performance is reduced or eliminated. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for fabricating a semiconductor structure, comprising:

forming a first semiconductor layer having a first crystal orientation; forming a second semiconductor layer and an adjacent isolation region over at least part of the first semiconductor layer, where the second semiconductor layer has a second crystal orientation that is different from the first crystal orientation and where the second semiconductor layer is electrically isolated from the first semiconductor layer; forminig a trench opening that exposes the first semiconductor layer; filling at least part of the trench opening by epitaxially growing a first epitaxial semiconductor material on at least an exposed surface of the first semiconductor layer to form a first epitaxial semiconductor layer that is higher than the isolation region; epitaxially growing a second epitaxial semiconductor material on at least an exposed surface of the second semiconductor layer to thicken the second semiconductor layer in a first circuit area so that the second semiconductor layer is higher than the isolation region; and polishing the first epitaxial semiconductor layer and the second semiconductor layer down to at least the isolation region so that the first epitaxial semiconductor layer is substantially coplanar with the second semiconductor layer.

2. The method of claim 1, where polishing the first epitaxial semiconductor layer and the second semiconductor layer comprises a chemical mechanical polish step.

3. The method of claim 1, where epitaxially growing a second epitaxial semiconductor material comprises selectively growing epitaxial silicon having the second crystal orientation to form a crystalline silicon layer on the second semiconductor layer to thicken the second semiconductor layer.

4. The method of claim 1, where epitaxially growing the first epitaxial semiconductor material and epitaxially growing the second epitaxial semiconductor material occur simultaneously.

5. The method of claim 1, where the second semiconductor layer comprises (100) p-type silicon and the first semiconductor layer comprises (110) n-type silicon.

6. The method of claim 1, where the second semiconductor layer comprises (110) p-type silicon and the first semiconductor layer comprises (100) n-type silicon.

7. The method of claim 1, where epitaxially growing the second epitaxial semiconductor material occurs prior to filling at least part of the trench opening.

8. The method of claim 1, where epitaxially growing the second epitaxial semiconductor material occurs after filling at least part of the trench opening.

9. The method of claim 1, where epitaxially growing the first epitaxial semiconductor material on at least an exposed surface of the first semiconductor layer comprises a selective silicon growth step that fills the trench higher than the isolation region.

10. The method of claim 9 where epitaxially growing the first epitaxial semiconductor material completely fills the trench.

11. The method of claim 1, further comprising blanket depositing silicon to form a polysilicon layer over the isolation region, to form a first crystalline silicon layer having the first crystal orientation over the first epitaxial semiconductor layer and to form a second crystalline silicon layer having the second crystal orientation over the second semiconductor layer, where at least the first and second crystalline silicon layers are substantially coplanar.

12. The method of claim 1, where filling at least part of a trench opening comprises:
forming a mask layer over at least the second semiconductor layer and a portion of the isolation region after epitaxially growing the second epitaxial semiconductor material;
patterning and etching the mask layer to form an opening through the isolation region and to the first semiconductor layer; and
epitaxially growing the first epitaxial semiconductor material on at least an exposed surface of the first semiconductor layer to form an first epitaxial semiconductor layer that is higher than the isolation region.

13. The method of claim 12, further comprising:
polishing the epi semiconductor layer below the mask layer but above the isolation region; and
stripping the mask layer.

14. The method of claim 1, where filling at least part of a trench opening comprises:
forming a mask layer over at least the second semiconductor layer and a portion of the isolation region before epitaxially growing the second epitaxial semiconductor material;
patterning and etching the mask layer to form an opening through the isolation region and to the first semiconductor layer; and
epitaxially growing the first epitaxial semiconductor material on at least an exposed surface of the first semiconductor layer to form an first epitaxial semiconductor layer that is higher than the isolation region.

15. The method of claim 1, further comprising:
forming a first gate electrode structure over the epi semiconductor layer, said first gate electrode structure comprising at least a first relatively high-k dielectric gate layer and a first conductive layer; and
forming a second gate electrode structure over the second semiconductor layer, said second gate electrode structure comprising at least a second relatively high-k dielectric gate layer and a second conductive layer.

16. A method of forming an integrated circuit structure, comprising:
forming a first semiconductor layer having a first crystal orientation;
forming a second semiconductor layer and an adjacent isolation region over at least part of the first semiconductor layer, where the second semiconductor layer has a second crystal orientation that is different from the first crystal orientation and where the second semiconductor layer is electrically isolated from the first semiconductor layer by a buried insulator layer;
selectively etching at least a portion of the isolation region to expose at least a portion of the first semiconductor layer;
epitaxially growing a first epitaxial semiconductor material on at least an exposed surface of the first semiconductor layer to form an first epitaxial semiconductor layer that is higher than the isolation region, where the first epitaxial semiconductor material has a crystal orientation that is the same as the first crystal orientation;
epitaxially growing a second epitaxial semiconductor material on at least an exposed surface of the second semiconductor layer to thicken the second semiconductor layer so that the second semiconductor layer is higher than the isolation region; and
polishing the first epitaxial semiconductor layer and second semiconductor layer until substantially coplanar.

17. The method of claim 16, where the second semiconductor layer comprises (110) p-type silicon, the first semiconductor layer comprises (100) n-type silicon and the second epitaxial semiconductor material has a higher deposition rate than the first epitaxial semiconductor material.

18. The method of claim 16, where epitaxially growing the first epitaxial semiconductor material occurs after epitaxially growing the second epitaxial semiconductor material.

19. The method of claim 16, where epitaxially growing the first epitaxial semiconductor material occurs simultaneously with epitaxially growing the second epitaxial semiconductor material.

20. A method for fabricating a semiconductor structure having planar dual-surface orientation substrates, comprising: forming first and second semiconductor substrates that are electrically isolated from each other by at least a first isolation region, where the first semiconductor substrate has a first crystallographic orientation and where the second semiconductor substrate has a second crystallographic orientation that is different from the first crystallographic orientation; forming exposed surface on the first and second semiconductor substrates by selectively etching at least a portion of one or more dielectric layers formed over the first or second semiconductor substrates; blanket depositing silicon on the exposed surfaces of the first and second semiconductor substrates to form a first epitaxial semiconductor layer on at least an exposed surface of the first semiconductor substrate that is higher than the first isolation region, and to form a second epitaxial semiconductor layer on at least an exposed surface of the second semiconductor substrate that is higher than the first isolation region; and polishing the first epitaxial semiconductor layer and the second epitaxial semiconductor layer down to at least the first isolation region so that the first epitaxial semiconductor layer is substantially coplanar with the second epitaxial semiconductor layer.

* * * * *

UNITED STATES PATENT AND TRADEMARK OFFICE
CERTIFICATE OF CORRECTION

| | | |
|---|---|---|
| PATENT NO. | : 7,378,306 B2 | Page 1 of 1 |
| APPLICATION NO. | : 11/375763 | |
| DATED | : May 27, 2008 | |
| INVENTOR(S) | : Gregory S. Spencer et al. | |

It is certified that error appears in the above-identified patent and that said Letters Patent is hereby corrected as shown below:

Claim 1, Column 14, line 62, "formining" should read --forming--

Claim 12, Column 15, line 62, "an first" should read --the first--

Claim 16, Column 16, line 39, "an first" should read --a first--

Signed and Sealed this

Twenty-ninth Day of July, 2008

JON W. DUDAS
*Director of the United States Patent and Trademark Office*